United States Patent
Tu et al.

(10) Patent No.: US 10,156,783 B2
(45) Date of Patent: Dec. 18, 2018

(54) IMAGE MASK FILM SCHEME AND METHOD

(71) Applicant: Taiwan Semiconductor Manufacturing Company, Ltd., Hsinchu (TW)

(72) Inventors: Chih-Chiang Tu, Tauyen (TW); Chun-Lang Chen, Madou Township (TW); Jong-Yuh Chang, Jhubei (TW); Boming Hsu, Tainan (TW); Tran-Hui Shen, Dounan Township (TW)

(73) Assignee: Taiwan Semiconductor Manifactuing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/443,535

(22) Filed: Feb. 27, 2017

(65) Prior Publication Data

US 2017/0168387 A1    Jun. 15, 2017

Related U.S. Application Data

(60) Continuation of application No. 14/841,141, filed on Aug. 31, 2015, now Pat. No. 9,581,894, which is a division of application No. 13/649,850, filed on Oct. 11, 2012, now Pat. No. 9,122,175.

(51) Int. Cl.
*G03F 1/74* (2012.01)
*G03F 1/46* (2012.01)
*G03F 1/48* (2012.01)

(52) U.S. Cl.
CPC ............... *G03F 1/74* (2013.01); *G03F 1/46* (2013.01); *G03F 1/48* (2013.01)

(58) Field of Classification Search
CPC ................ G03F 1/46; G03F 1/48; G03F 1/74
USPC ..................... 430/5, 30, 296, 942
See application file for complete search history.

(56) References Cited

U.S. PATENT DOCUMENTS

| | | | |
|---|---|---|---|
| 6,361,904 B1 | 3/2002 | Chiu | |
| 6,897,157 B2 | 5/2005 | Liang et al. | |
| 7,229,932 B2 | 6/2007 | Lu | |
| 8,568,959 B2 | 10/2013 | Bartlau et al. | |
| 9,122,175 B2 * | 9/2015 | Tu | G03F 1/48 |
| 9,581,894 B2 * | 2/2017 | Tu | G03F 1/48 |
| 2008/0318139 A1 | 12/2008 | Dersch et al. | |
| 2010/0215909 A1 | 8/2010 | MacDonald | |
| 2011/0244377 A1 | 10/2011 | Levinson et al. | |
| 2011/0244378 A1 | 10/2011 | Lin et al. | |
| 2014/0255825 A1 | 9/2014 | Tu et al. | |

OTHER PUBLICATIONS

Kinney et al. "The Structure of the Organoboron Oxides" Polarity of Nitrogen Oxide Molecules Contribution No. 50 From the Chemical Laboratory of the University of Utah Feb. 1936 pp. 197.
Wu et al. "MoSi Etch of Phase-Shift Masks" Society of Photo-Optical Instrumentation Engineers Jan. 2003 pp. 54-60.

* cited by examiner

*Primary Examiner* — Christopher G Young
(74) *Attorney, Agent, or Firm* — Slater Matsil, LLP

(57) ABSTRACT

A system and method for repairing a photolithographic mask is provided. An embodiment comprises forming a shielding layer over an absorbance layer on a substrate. Once the shielding layer is in place, the absorbance layer may be repaired using, e.g., an e-beam process to initiate a reaction to repair a defect in the absorbance layer, with the shielding layer being used to shield the remainder of the absorbance layer from undesirable etching during the repair process.

20 Claims, 7 Drawing Sheets

INTENSITY PROFILE

| FOCUS | INTENSITY |
|---|---|
| 0.0744 | 0.6413 |
| 0.0496 | 0.6587 |
| 0.0248 | 0.6720 |
| -0.0000 | 0.6793 |
| -0.0248 | 0.6828 |
| -0.0496 | 0.6765 |
| -0.0744 | 0.6650 |

PROFILE (MICRONS AT WAFER)

| FOCUS | INTENSITY |
|---|---|
| 0.0744 | 0.6079 |
| 0.0496 | 0.6267 |
| 0.0248 | 0.6437 |
| -0.0000 | 0.6548 |
| -0.0248 | 0.6622 |
| -0.0496 | 0.6634 |
| -0.0744 | 0.6579 |

IMAGE MASK FILM SCHEME AND METHOD

This application is a continuation of U.S. patent application Ser. No. 14/841,141, filed Aug. 31, 2015, and entitled "Image Mask Film Scheme and Method," which application is a divisional of U.S. patent application Ser. No. 13/649,850, filed Oct. 11, 2012, and entitled "Image Mask Film Scheme and Method," now U.S. Pat. No. 9,122,175 issued Sep. 1, 2015, which applications are incorporated herein by reference.

BACKGROUND

Generally, photolithographic masks are utilized to pattern an energy source such as light as the light passes through the photolithographic mask from one side to another. The patterned light may then be directed towards a photoresist material that has been previously applied to, for example, a semiconductor substrate that is being processed. The patterned light will cause a reaction with photoacid generators located within the photoresist material to form an acid within those areas illuminated by the patterned light. This acid will then react with other components of the photoresist material within the portion illuminated by the energy source to form a chemically distinct polymer. This chemically distinct polymer may then be separated from the unilluminated portion of the photoresist to form either a positive or negative image of the patterned light (depending upon which portion is being removed), in a process known as developing the photoresist. Once the photoresist has been developed, the photoresist may be utilized as a mask during the formation of devices, isolation regions, metallization layers, or other structures on the semiconductor wafer.

The photolithographic masks may themselves be formed utilizing lithographic techniques, whereby a portion of the photolithographic mask is removed to form the desired pattern. This removal process may involve a chemical etchant that reacts with a portion of the photolithographic mask to chemically modify and remove the desired portions of the photolithographic mask.

However, during the patterning of the photolithographic mask, defects can occur that undesirably alter the desired pattern of the photolithographic mask. These defects may occur by blocking too much light, otherwise known as an opaque defect, or by blocking too little light, otherwise known as a clear defect. Unless these defects are fixed, the photolithographic mask will transfer the defective pattern to the semiconductor device, forming defects within the semiconductor device. Such defects may render the semiconductor device inefficient or even unusable.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a photolithographic mask for use as a reticle in photolithographic processing of the 20 nm or less processing nodes. Other embodiments may also be applied, however, to other repair processes and masks.

Figure 1:
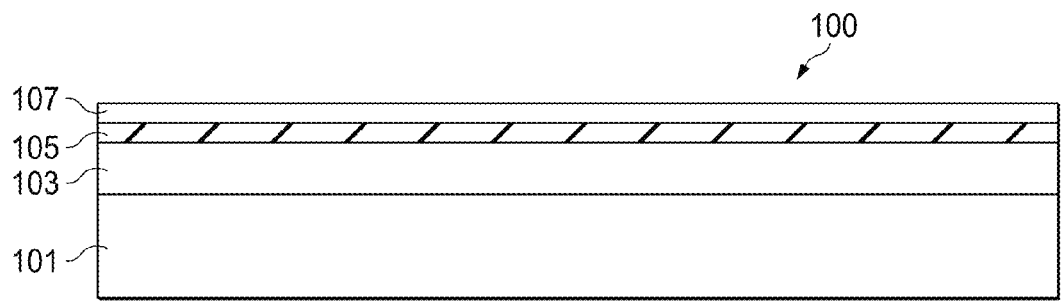
FIG. 1 illustrates a photolithographic mask with a substrate, an absorbance layer, an anti-reflective coating layer, and a shielding layer in accordance with an embodiment.

With reference now to FIG. 1, there is shown a photolithographic mask 100 with a substrate 101, an absorbance layer 103, an anti-reflective coating (ARC) layer 105, and a shielding layer 107. In an embodiment the substrate 101 may comprise a translucent material such as quartz that may be used to provide support to the remaining structure of the photolithographic mask 100 while also allowing light to pass through unimpeded. As such, the substrate 101 is not limited to quartz, and may be any suitable material that allows radiation to pass through the material, such as glass, sapphire, synthetic quartz, fused silica, magnesium fluoride ($MgF_2$), calcium fluoride ($CaF_2$), combinations of these, or the like. The substrate 101 may have a thickness of between about 6.0 mm and about 6.5 mm, such as about 6.35 mm.

The absorbance layer 103 may be formed on the substrate 101 and may be used to absorb or block radiation such as light from passing through the absorbance layer 103. As such, the absorbance layer 103 is the layer that will actually pattern light (e.g., light with a wavelength of 193 nm or other light useful for photolithographic purposes) as the light passes through the absorbance layer 103. The absorbance layer 103 may be formed using a process such as sputtering, although any other suitable process, such as chemical vapor deposition (CVD), plasma deposition, plating, combinations of these, or the like, may alternatively be utilized.

In an embodiment the absorbance layer 103 may be an opaque material, such as an Opaque Molybdenum silicide On Glass (OMOG) layer. In an embodiment the OMOG layer may comprise MoSiOxNy with a molybdenum concentration of about 8.1% (atomic), a silicon concentration of about 41.3% (atomic), and a nitrogen concentration of about 50.6% (atomic). In an embodiment the absorbance layer 103 may have a thickness of between about 35 nm and about 60 nm, such as about 37 nm, may have a dielectric coefficient (K) value of between about 2.1 and about 2.8, such as about 2.63, and may have an index of reflection (N) value of between about 1.5 and about 2.0, such as about 1.82.

However, as one of ordinary skill in the art will recognize, while the absorbance layer 103 is described as a layer for the absorbance of light, the processes and embodiments described herein are not limited to only being utilized with opaque materials. Rather, the processes and embodiments disclosed herein are fully intended to be utilized with a wide variety of materials, including transparent materials such as transparent OMOG. These are fully intended to be included within the scope of the embodiments.

The ARC layer 105 is used to reduce or prevent reflection off of the materials that may affect occur during illumination so that such reflection does not hinder the desired process. In an embodiment the ARC layer 105 may be one or more layers of an anti-reflective material and may be the same material as the absorbance layer 103 (e.g., OMOG) with, e.g., a different composition such as a molybdenum composition of 1~2%, a silicon composition of 50~55%, and a nitrogen composition of 40~50%. However, other anti-reflective materials such as chromium oxide (CrO), calcium fluoride, magnesium fluoride, metal nitroso compounds, metal halide, ITO, silicon oxide ($SiO_2$), tantalum oxide ($TaO_5$), aluminum oxide ($Al_2O_3$), titanium nitride (TiN), zirconium oxide (ZrO), aluminum (Al), silver (Ag), gold (Au), indium (In), combinations thereof, or the like, may alternatively be utilized. The ARC layer 105 may be formed using an sputter deposition process, a plasma sputter deposition process, or the like, and may be formed to a thickness of between about 5 and about 20 nm, such as about 18 nm, have a K value of between about 0.7 and about 0.9, such as about 0.82, and an N value of between about 2.1 and about 2.5, such as about 2.33.

Over the ARC layer 105, the shielding layer 107 may be formed in order to modify the etch rate of the materials of the photolithographic mask 100 during a defect repair process (not illustrated in FIG. 1 but illustrated and discussed below with respect to FIG. 5) and better control the repair process. In an embodiment the shielding layer 107 may be formed to have a thickness of between about 5 nm and about 20 nm, such as about 10 nm, and may comprise one or more layers of material.

In an embodiment the shielding layer 107 may comprise a material similar to the absorbance layer 103. In an embodiment in which the absorbance layer 103 is an OMOG layer comprising $MoSiO_xN_y$, the shielding layer 107 may similarly comprise $MoSiO_xN_y$, but will have a different concentration of the atoms in order to increase the activation energy of the shielding layer 107 over the absorbance layer 103. For example, in one embodiment the shielding layer 107 may have a molybdenum composition of between about 1% to about 5% and comprise a silicon rich $MoSiO_xN_y$, with a silicon concentration greater than that of the absorbance layer 103, such as being greater than about 41.3%, such as between about 45% and about 52%. In some embodiments, the shielding layer 107 may have a silicon composition of about 46.3% (with a molybdenum concentration of 3.8% and a nitrogen concentration of about 49.9%) or even 51.9% (with a molybdenum concentration of 1.6% and a nitrogen concentration of about 46.5%). In a silicon-rich embodiment the shielding layer 107 may have a K value of between about 0.5 and about 0.7, such as about 0.69, and an N value of between about 2.1 and about 2.5, such as about 2.34. In such an embodiment the photolithographic mask 100 may have a reflectance percent of about 14.8%.

By forming the shielding layer 107 to be silicon rich, the shielding layer 107 has a higher binding energy and a higher activation energy than the absorbance layer 103. For example, when the shielding layer 107 is silicon rich, there is an abundance of silicon oxide material (e.g., silicon atoms bonded to oxygen atoms) within the shielding layer 107, which material has a binding energy of 3231 KJ/Mol. This is much higher than the binding energy of 1350 KJ/Mol that the MoSi-rich materials of the absorbance layer 103. This larger binding energy and activation energy is utilized along with a higher enthalpy of vaporization and a smaller free volume in order to lower the reaction rate of the shielding layer 107 during an etching process (described further below with respect to FIG. 5) used to repair the photolithographic mask 100. By slowing the rate of reaction, the reaction can be better controlled and undesired removal of material from the photolithographic mask 100 may be reduced or avoided, leading to a better repair process. Additionally, by forming the shielding layer 107 to be silicon rich, the shielding layer 107 will also be harder than the absorbance layer 103, leading to better protection to the absorbance layer 103.

Additionally, in an embodiment in which the shielding layer 107 is the same material as the absorbance layer 103, the same process flows may be utilized to form the shielding layer 107 and the absorbance layer 103, allowing such embodiments to be fully integrated into process flows without additional retooling. For example, the absorbance layer 103, the ARC layer 105 and the shielding layer 107 may be formed in a single process step by adjusting the parameters during formation, or else may be formed using separate process steps that are independent from each other. Further, changing the composition to the shielding layer 107 has a minimal effect on the reflectivity on the shielding layer 107. For example, in an embodiment in which the shielding layer is formed as described above, the shielding layer 107 may have a reflectivity of about 14.8%, which is comparable to the absorbance layer 103 reflectivity of about 12%.

However, while the embodiment described above is an embodiment in which the shielding layer 107 is the same material as the absorbance layer 103, the shielding layer 107 is not limited as such. Rather, any material that can be used to slow the rate of reaction of the absorbance layer 103 during a repair process may alternatively be utilized. For example, the shielding layer 107 may be silicon nitride, silicon oxide, silicon oxynitride, or any other suitable nitride or oxide material. Additionally, the shielding layer 107 may also comprise a metal/metal oxide material such as tantalum/tantalum oxide (Ta/TaO) or titanium/titanium oxide (Ti/TiO). All of these materials and other materials which raise the activation energy of the photolithographic mask 100 are fully intended to be included within the scope of the embodiments.

Optionally, the shielding layer 107 may be formed to have a greater thickness than the ARC layer 105. For example, in an embodiment the ARC layer 105 may have a thickness of about 8 nm while the shielding layer 107 may have a thickness larger than about 8 nm, such as about 10 nm. However, any desired thicknesses may alternatively be utilized. In such an embodiment the reflectance of the photolithographic mask 100 may have a reflectance percent of about 15.2%.

Figure 2:
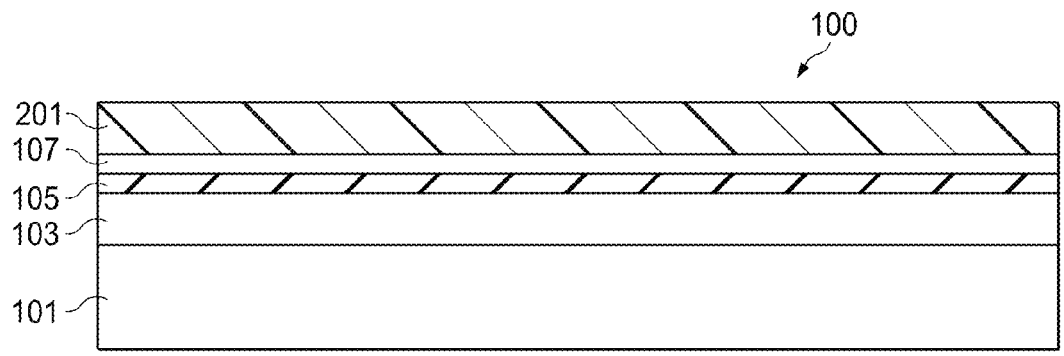
FIG. 2 illustrates a hard mask layer formed over the shielding layer in accordance with an embodiment.

FIG. 2 illustrates a formation of a hard mask layer 201 that will be used for patterning the absorbance layer 103. In an embodiment the hard mask layer 201 may be a layer of chromium formed using, e.g., a sputter deposition process, although other suitable materials and methods of formation may alternatively be utilized. In an embodiment the hard mask layer 201 may be formed to a thickness of between about 5 nm and about 10 nm, such as about 5 nm.

Figure 3:
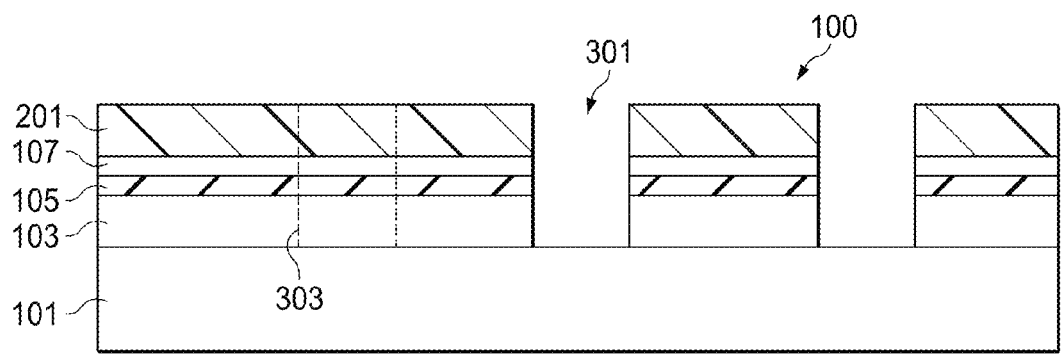
FIG. 3 illustrates a patterning of the photolithographic mask using the hard mask layer and a defect in accordance with an embodiment.

FIG. 3 illustrates a patterning of the hard mask layer 201, the shielding layer 107, the ARC layer 105, and the absorbance layer 103. In an embodiment the hard mask layer 201 may be initially patterned by placing a photoresist material (not illustrated) onto the hard mask layer 201 using, e.g., a spin-coating process. Once in place, the photoresist material is patterned using, e.g., an e-beam tool to transfer the desired pattern from, e.g., a GDS file where the pattern is stored, to the photoresist material. The photoresist material is then baked and developed for use as a mask.

Additionally, as one of ordinary skill in the art will recognize, the above described method of applying a photoresist and transferring the pattern with an e-beam tool is not the only method which may be utilized to pattern the hard mask layer 201. Rather, any suitable method of patterning, including applying the photoresist, exposing the photoresist to a patterned energy source such as light, and developing the photoresist, may alternatively be utilized. This and any other suitable method of patterning the hard mask layer 201 are fully intended to be included within the scope of the embodiment.

Once the photoresist has been patterned, the photoresist may be used as a mask to pattern the underlying hard mask layer 201. In an embodiment in which the hard mask layer 201 is chromium, the pattern may be transferred from the photoresist to the hard mask layer 201 using, e.g., a dry etch process using etchants such as chlorine ($Cl_2$) and oxygen ($O_2$) plasma. However, any suitable etchants or processes may alternatively be utilized to transfer the pattern from the photoresist to the hard mask layer 201.

Once the hard mask layer 201 has been patterned, the photoresist may be stripped using, e.g., an ashing process or wet etching process, and the hard mask layer 201 is then used as a mask in order to pattern the underlying shielding layer 107, the ARC layer 105, and the absorbance layer 103 in order to form openings 301. In an embodiment in which the shielding layer 107, the ARC layer 105, and the absorbance layer 103 are all the same material (e.g., OMOG), a dry etch process utilizing etchants such as silicon fluoride ($SF_6$) and oxygen ($O_2$) plasma may be utilized to transfer the pattern from the hard mask layer 201 to the absorbance layer 103.

Alternatively, if the shielding layer 107 is a different material than either the ARC layer 105 or the absorbance layer 103, one or more etching processes may be utilized to etch the absorbance layer 103 and transfer the pattern. Any suitable process or series of processes may be utilized in order to transfer the pattern from the hard mask layer 201 to the absorbance layer 103.

FIG. 3 also illustrates a defect 303 that may occur during the patterning of the photolithographic mask 100. For example, given the small sizes that are found in the photolithographic mask 100, the patterning of the hard mask layer 201 may undesirably result in the hard mask layer 201 not being fully removed in certain areas. Without the hard mask layer 201 being removed, the underlying layers (such as the shielding layer 107, the ARC layer 105, and the absorbance layer 103), will remain masked and will not be removed during the subsequent etching, even though they are desired to be removed, causing the defect 303 to occur. Without this section of the absorbance layer 103 being removed, this portion of the photolithographic mask 100 remains opaque to light transmission, and is known as an opaque defect.

Figure 4:
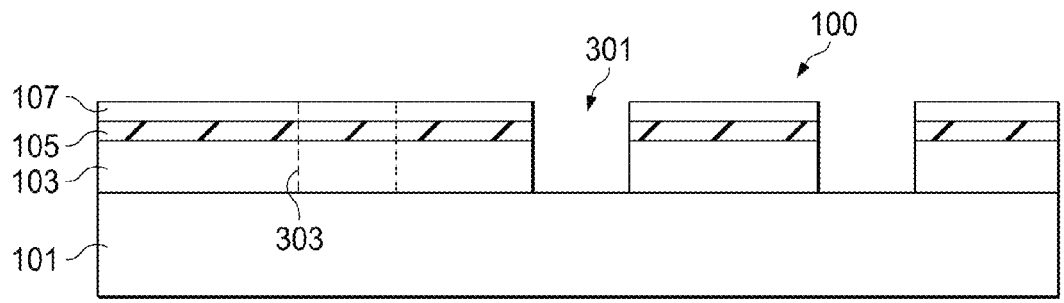
FIG. 4 illustrates a removal of the hard mask layer from the shielding layer in accordance with an embodiment.

FIG. 4 illustrates a removal of the hard mask layer 201 after the patterning of the shielding layer 107, the ARC layer 105, and the absorbance layer 103. In an embodiment the hard mask layer 201 may be removed using a stripping process such as a wet etch to strip the hard mask layer 201 from the shielding layer 107. However, as can be seen, the defect 303 remains within the shielding layer 107, the ARC layer 105, and the absorbance layer 103 after the hard mask layer 201 has been removed.

This defect may be found by verifying the photolithographic mask 100. In particular, the defect may be found by performing a luminosity test on the photolithographic mask 100, which may illustrate where the defect 303 has occurred. This verification process may be performed using a Zess MG45 or HR32 e-beam repair tool.

Figure 5:
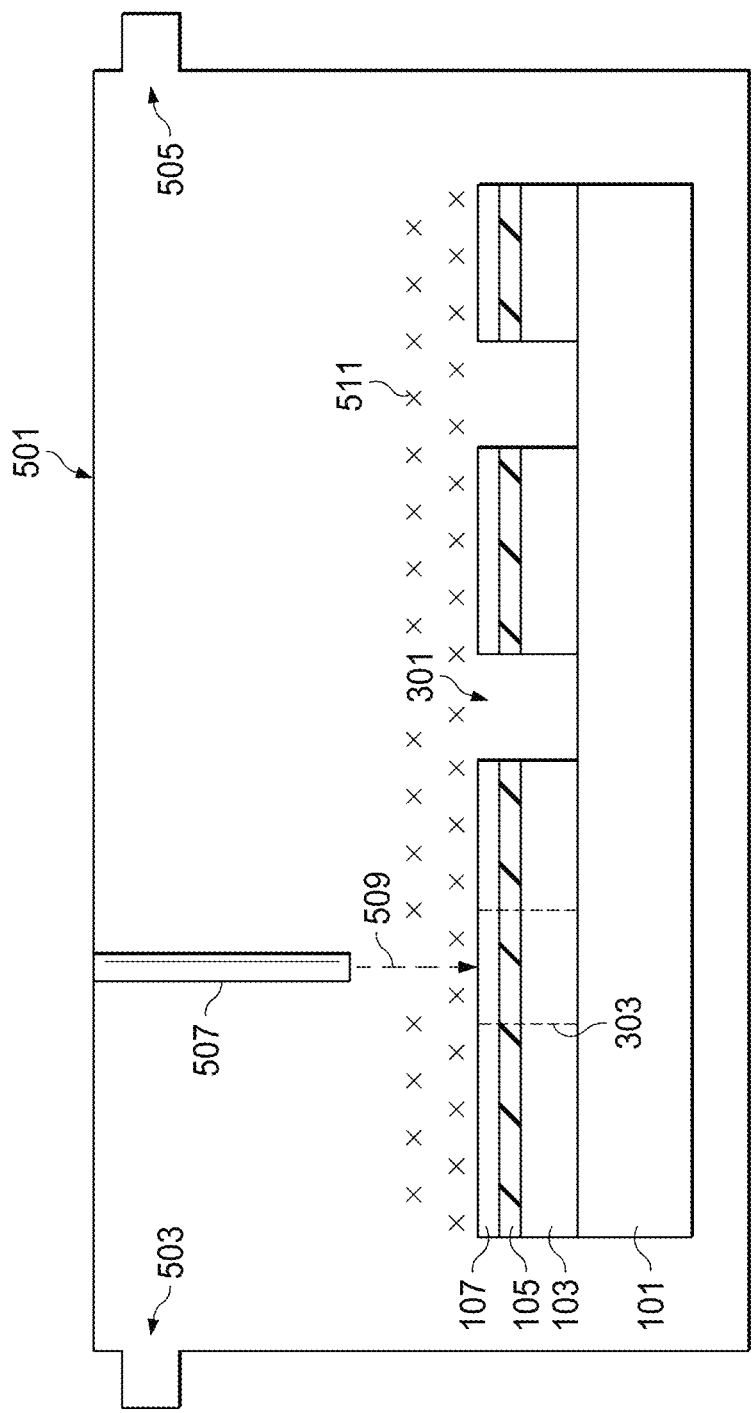
FIG. 5 illustrates a repair process used to repair the photolithographic mask in accordance with an embodiment.

FIG. 5 illustrates the start of a repair process that may be used to repair the defect 303 in the shielding layer 107, the ARC layer 105, and the absorbance layer 103. In an embodiment the repair process may begin by placing the photolithographic mask 100 into a reaction chamber 501 with an influent 503 and an effluent 505. The reaction chamber 501 also contains an electron beam system 507 which will be used to deliver an electron beam 509 where desired in order to initiate and promote chemical etching at the surface of the photolithographic mask 100 (described in more detailed below).

Once the photolithographic mask 100 has been placed into the reaction chamber 500, the reaction chamber 500 is hermetically sealed away from the ambient environment and the reaction chamber 500 is purged prior to the introduction of etchants 511 that will be used to repair the photolithographic mask 100. As one of ordinary skill in the art will recognize, the etchants 511 that will be utilized to repair the photolithographic mask 100 are dependent at least in part on the precise materials utilized for the absorbance layer 103, the ARC layer 105, and the shielding layer 107. However, in an embodiment in which the absorbance layer 103, the ARC layer 105, and the shielding layer 107 are a material such as OMOG, the etchant 511 may be xenon difluoride ($XeF_2$). However, any suitable etchant or combination of etchants, such as a combination of $SF_6$ and $O_2$, may alternatively be utilized to help repair the photolithographic mask 100.

Once the etchant 511 has been selected and the reaction chamber 501 has been sealed and purged, the reaction chamber 501 may be brought to the desired reaction conditions. In an embodiment the pressure in the reaction chamber 501 may be brought and held to a pressure of between about $2e^{-5}$ mbar and about $5e^{-5}$ mbar, such as about $3.7e^{-5}$ mbar. Additionally, the temperature of the reaction chamber 501 (and the photolithographic mask 100 within the reaction chamber 501), may be brought to and held between about 20° C. and about 24° C., such as about less than 21° C. and a gas temperature is about −10° C. Such process conditions allow for better control of the rates of reaction that will occur within the reaction chamber 501 between the photolithographic mask 100 and the etchants 511.

Once the reaction chamber 501 has been brought to the desired conditions, the etchant 511 may be introduced into the reaction chamber 501 through the influent 503. In an embodiment the etchant 511 may be introduced into the reaction chamber 501 at a flow rate of between about 0.05 sccm and about 0.5 sccm, such as about 0.1 sccm, while the etchants 511 may be removed from the reaction chamber 501 through the effluent 505 so that the dwell time is between about 0.04 s and about 0.1 s, such as about 0.08 s. During the process, the etchant 511 may be continually supplied to the reaction chamber 501 through the influent 503 and continually removed from the reaction chamber 501 through the effluent 505. Once introduced, the etchant 511 will fill the reaction chamber 501, with a portion of the etchant 511 being located adjacent to the surface of the shielding layer 107 (the remainder of the etchant 511 within the reaction chamber 501 is not illustrated in FIG. 5 for clarity).

Optionally, the etchant 511 may be diluted using a suitable diluent. Diluting the etchant 511 with a diluent reduces the concentration of the etchant 511 in the reaction chamber 501, thereby also helping to lower the rate of reaction between the shielding layer 107 and the etchant 511. This lowering of the rate of reaction allows for a better process control of the reaction, which allows for less defects to occur during the repair process. In an embodiment water ($H_2O$) may be utilized as a diluent, although other gases, such as nitrous oxide ($NO_2$), may alternatively be utilized. The diluent may be added at a flow rate of between about 1 sccm and about 3 sccm, such as about 1.5 sccm.

Once the etchant 511 has been introduced into the reaction chamber 501 and the process conditions within the reaction chamber 501 have come to processing conditions, the electron beam system 507 may be started to generate the electron beam 509 to initiate a chemical reaction between the $XeF_2$ and the material on the photolithographic mask 100. In an embodiment the electron beam system 507 may use one or more sources of electrons, such as a field electron emission source or thermionic source using, e.g., heated tungsten/zirconium oxide in order to generate electrons. Once generated, the electrons may be passed through one or more lenses (not individually illustrated in FIG. 5) in order to focus and direct the electrons towards the photolithographic mask 100 as the electron beam 509. The one or more lenses may be, e.g., magnetic lenses, although any suitable lens may alternatively be utilized. For example, in some embodiment, an electrostatic lens may be suitable, and may alternatively be used.

In an embodiment the electron beam 509 is directed towards the defect 303 on the photolithographic mask 100. As the electron beam 509 intersects the etchant 511 and the shielding layer 107, the electron beam 509 initiates a reaction between the etchant 511 and the material of the shielding layer 107 in order to begin etching and removing the shielding layer 107, the ARC layer 105, and the absorbance layer 103 to remove the defect 303. By initiating and maintaining the etching along the presence of the electron beam 509, the defect 303 may be etched away and removed in order to repair the photolithographic mask 100.

However, during the repair process utilizing the electron beam 509, the etching is not perfectly defined by the presence of the electron beam 509, and undesirable etching may occur in places other than the defect 303. In particular, without the presence of the shielding layer 107, the etchant 511 (e.g., $XeF_2$) could also undesirably etch other portions of the absorbance layer 103, causing an undesirable fall in the blocking ability of the absorbance layer 103, creating another defect (e.g., a clear defect) during the repair process. Such a fall would allow light to pass through those areas of the absorbance layer 103 during use of the photolithographic mask 100.

In particular, without the shielding layer 107, the reaction rate between the etchant 511 and the absorbance layer 103 appears to be activation controlled rather than controlled by the mass transfer of the reactants and the products. For example, when an mixture of etchants such as $SF_6$ and $O_2$ is utilized, the absorbance layer 103 (e.g., the OMOG layer) will react with the etchants at the rate illustrated by Equation 1:

$$r_A = 0.6784 \ W_{ICP} \exp(-79.55/V_{DCB}) C^{1/5}_{SF6} C^{1/2}_{O2} \qquad \text{Eq. 1}$$

Where: $W_{ICP}$ is a plasma source power
$V_{DCB}$ is a DC bias voltage
$C_{SF6}$ is a concentration of $SF_6$
$C_{O2}$ is a concentration of $O_2$ As can be seen, the gaseous reactant has a low reaction order and has a weak effect on the reaction rate. As such, the gas-solid reaction is activation controlled rather than mass-transfer controlled.

By utilizing the occurrence that the reaction is activation controlled, the presence of the shielding layer 107 may be used to increase the activation energy at the gas-solid interface between the etchant 511 and the shielding layer 107, thereby working to lower the reaction rate and provide a shielding or masking function to the underlying layers (e.g., the ARC layer 105 and the absorbance layer 103). This remains true even if a similar material (e.g. OMOG) is utilized for both the absorbance layer 103 and the shielding layer 107, as long as the composition of the material used for the shielding layer 107 has a higher activation energy than the composition of the material used for the absorbance layer 103. By forming the shielding layer 107 to have a higher activation energy, the higher activation energy, along with the material's enthalpy of vaporization, will lower the reaction rate at the gas-solid interface, thereby leading to a better controlled reaction and less defects occurring during the repair process.

In addition to controlling the reaction rate of the etching reaction, the use of a similar material as the absorbance layer 103 but with a different composition also has two additional benefits. In particular, the shielding layer 107 may be formed to a composition that has a smaller free volume and is harder than the absorbance layer 103. These functions may work together to help protect the underlying layers such as the ARC layer 105 and the absorbance layer 103.

Figure 6A:
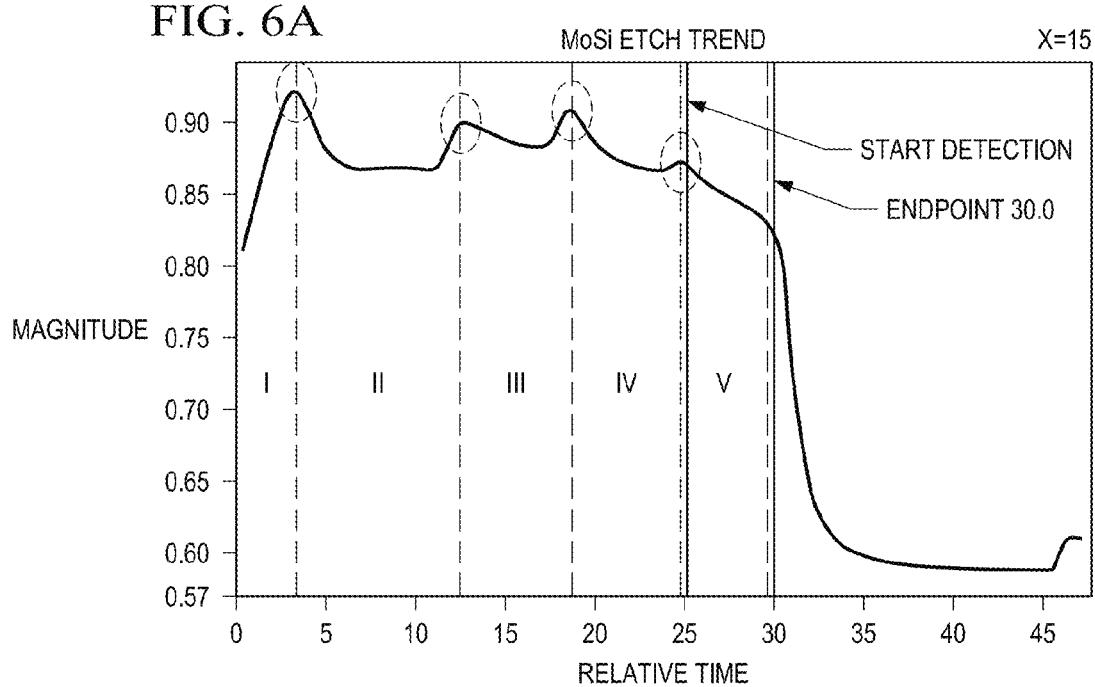
FIGS. 6A-6D illustrate a reduction in the rate of reaction with the shielding layer in accordance with an embodiment.
Figure 6B:
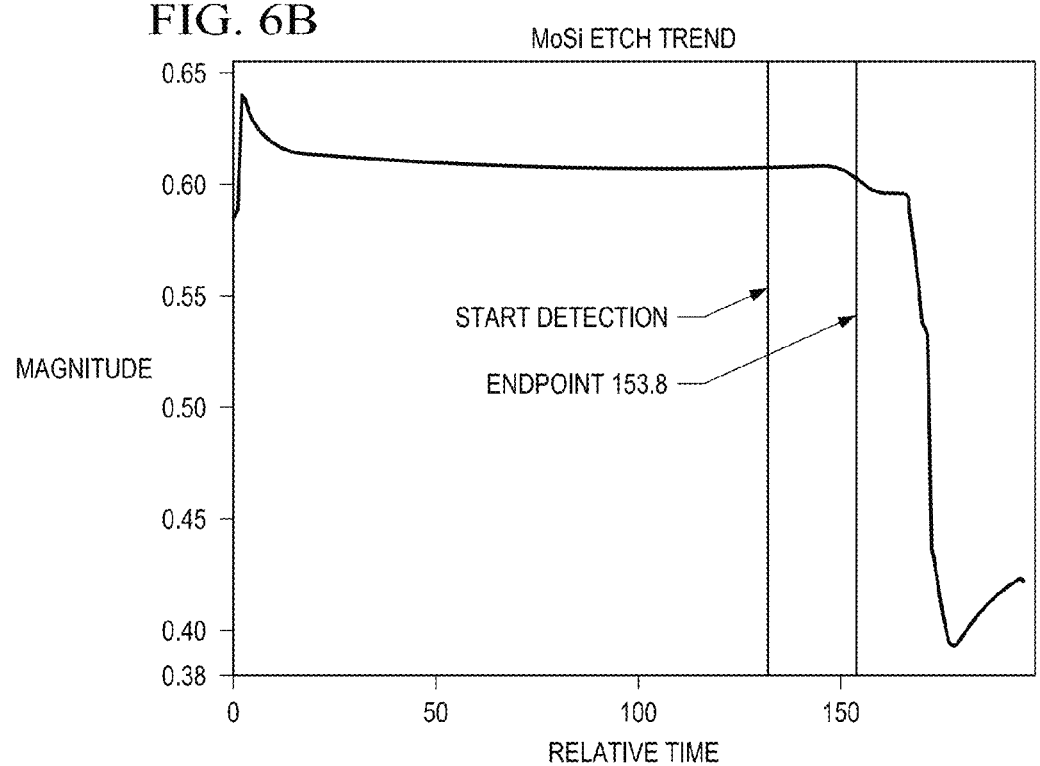

The rate of reaction using an etchant such as $SF_6$ or $CF_4$ between the shielding layer 107, the ARC layer 105, and the absorbance layer 103 is illustrated in FIGS. 6A-6B. As illustrated in FIG. 6A, the ARC layer 105 (labeled as Section I in FIG. 6A with a molybdenum composition of 1~2% and a silicon composition of 50~55%) is about 18 nm thick and is etched in about 3 seconds, leading to an etch rate of about 60 Å/sec. Additionally, the absorbance layer 103 in FIG. 6A is illustrated as four different regions label Section II (with a molybdenum composition of 8.1% and a silicon composition of 41.3%), Section III (with a molybdenum composition of 7.0% and a silicon composition of 42%), Section IV (with a molybdenum composition of 6.0% and a silicon composition of 43%), and Section V (with a molybdenum composition of 5.5% and a silicon composition of 43.5%), respectively, wherein each section has a slightly different Mo doping. However, as can be seen, with Section II being about 18 nm thick and the rest being about 9 nm thick, the etch rate of the absorbance layer is between about 10 Å/sec and 18 Å/sec (Section II: 10 Å/sec, Section III: 12.8 Å/sec, Section IV: 15 Å/sec, and Section V, 18 Å/sec).

However, in FIG. 6B, the etch rate of the shielding layer 107 is illustrated. With a thickness of about 76 nm and a molybdenum composition of 3.8% and a silicon composition of 46.3%, the shielding layer 107 has an etch rate of about 5 Å/sec. This etch rate is much lower than the etch rates illustrated above in FIG. 6A, and allows for much greater process control and masking from the shielding layer 107 as the shielding layer 107 protects the ARC layer 105 and the absorbance layer 103 during the etching of the repair process.

Figure 6C:
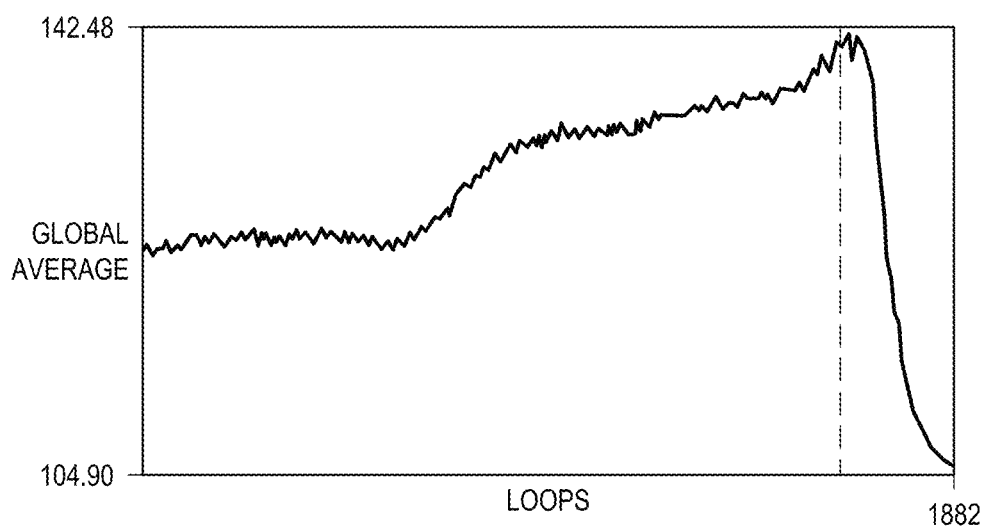
Figure 6D:
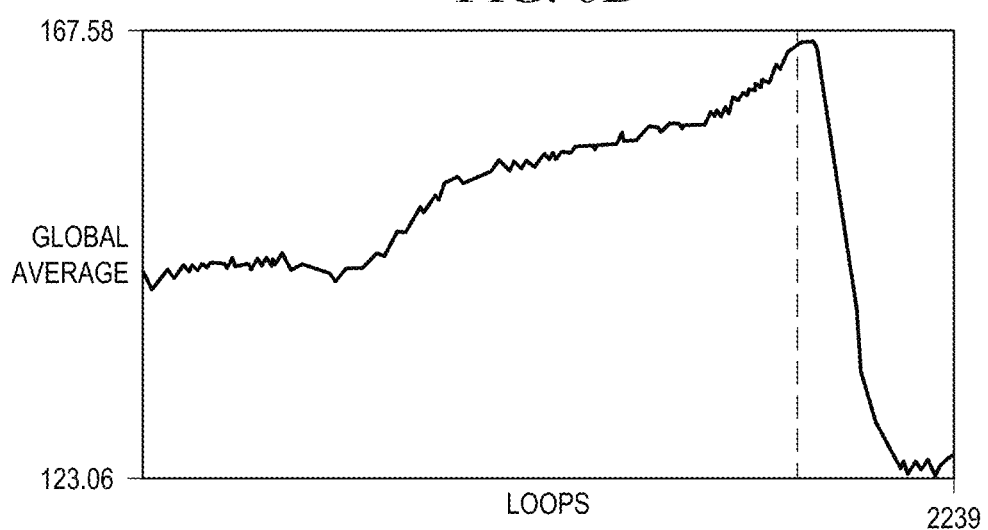

FIGS. 6C-6D illustrate this reduction in the rate of reaction in another fashion, with FIG. 6C illustrating an etch of an absorbance layer 103 with a molybdenum composition of 8.1% and a silicon composition of 41.3%. With this composition and a thickness of about 550 Å thick, the absorbance layer 103 was etched using a loop etch and a cut point etching signal stop loop of 1650. In this etch the etching process took approximately three minutes to etch the 550 Å of material.

However, FIG. 6D illustrates an etch of the shielding layer 107 with a molybdenum composition of 1~5% and a silicon composition of 45~50%. With this composition, the shielding layer 107 material using etched using a loop etch and a cut point etching signal stop loop of 1870 and a thickness of about 560 Å. In this etch the etching process took approximately four minutes to etch the 560 Å of the shielding layer 107 material. As such, using the shielding layer 107 material the reaction rate of the repair process may be slowed down by 30%, allowing for a better process control and less undesirable damage during the repair process.

Figure 7:
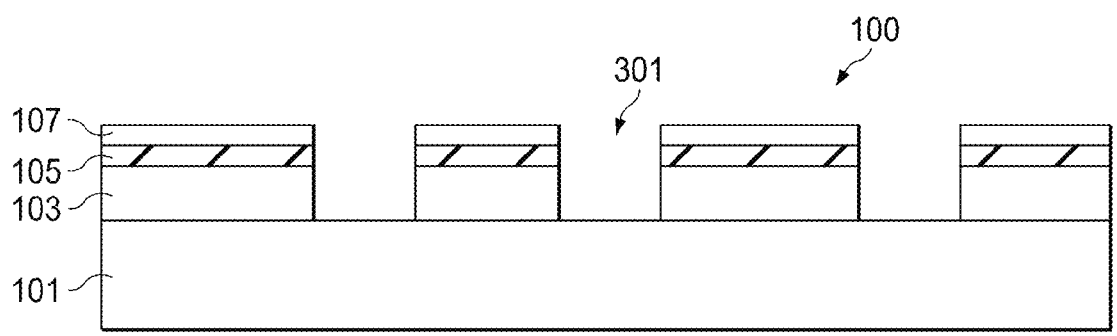
FIG. 7 illustrates a repaired photolithographic mask with the defect removed in accordance with an embodiment.

FIG. 7 illustrates a resulting structure after the defect 303 has been removed from the photolithographic mask 100. However, by including the shielding layer 107 to help reduce the activation energy of the reaction and provide a shielding or masking function, undesirable etching of the photolithographic mask 100 in areas other than the defect 303 are reduced or eliminated. By reducing this undesirable etching, additional defects may be avoided, and a more efficient photolithographic mask 100 may be obtained.

Figure 8A:
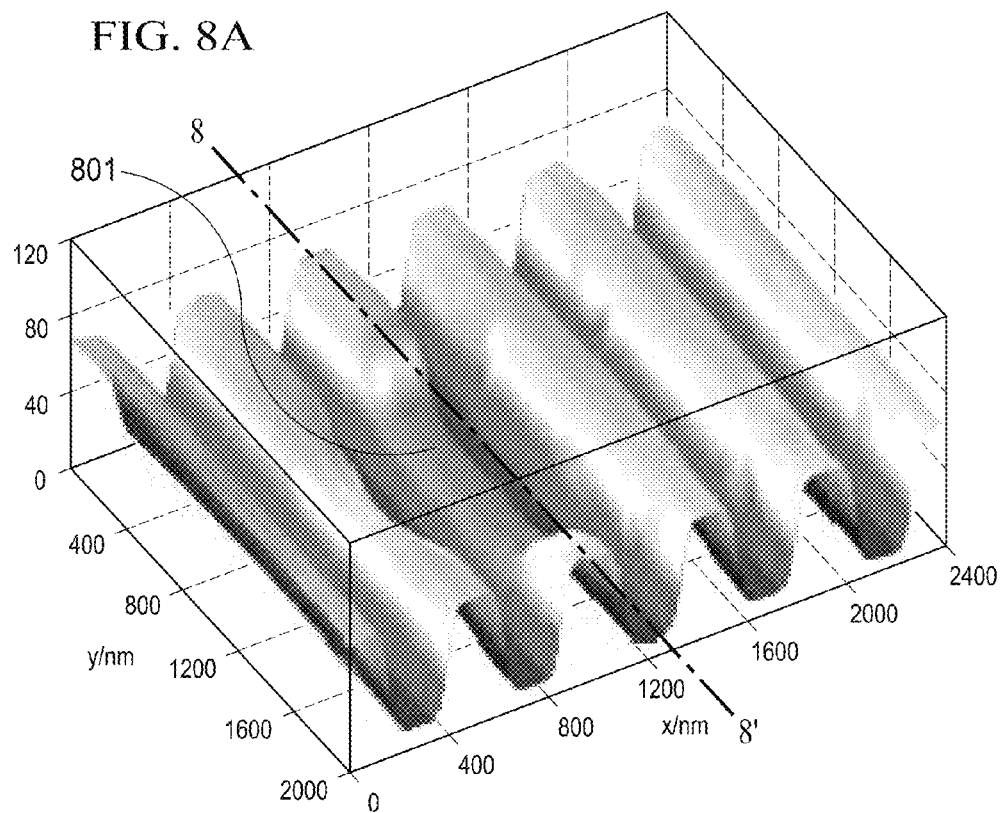
FIGS. 8A-8B illustrate a reduction in the amount of defects caused by the repair process in accordance with an embodiment.
Figure 8A:
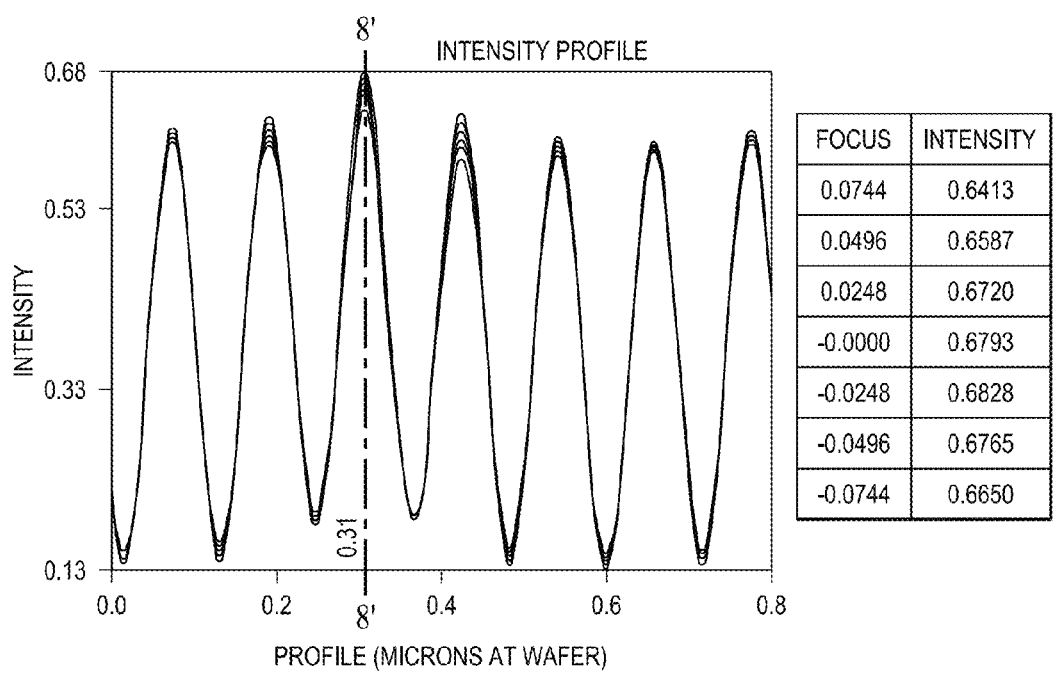
Figure 8B:
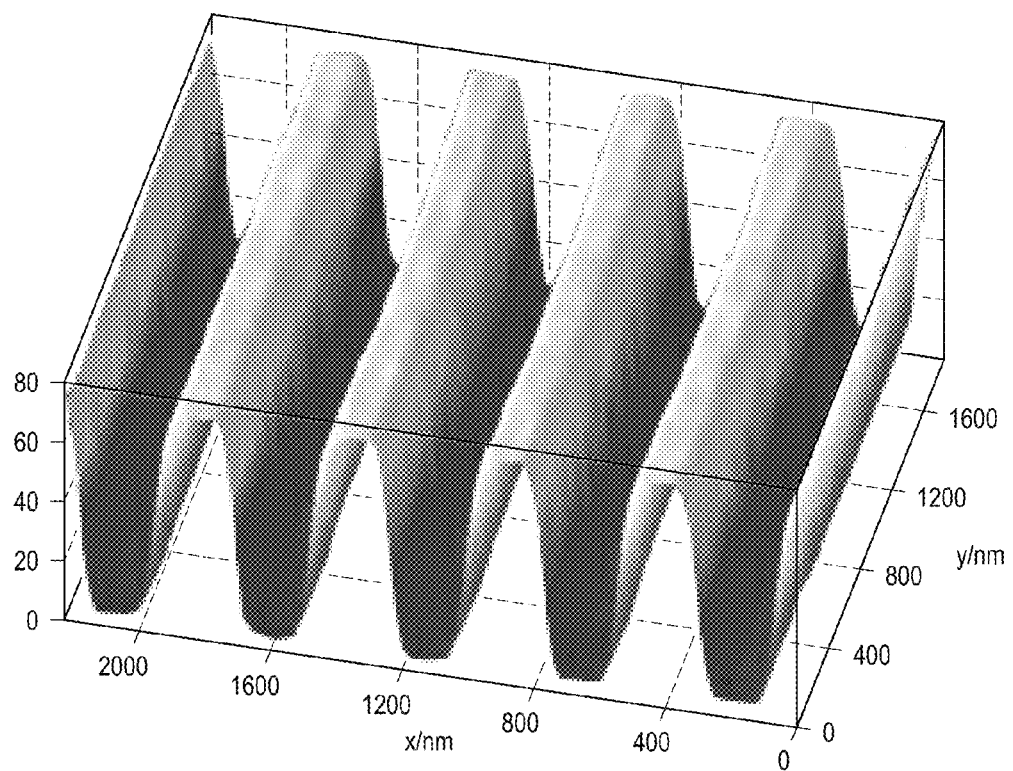
Figure 8B:
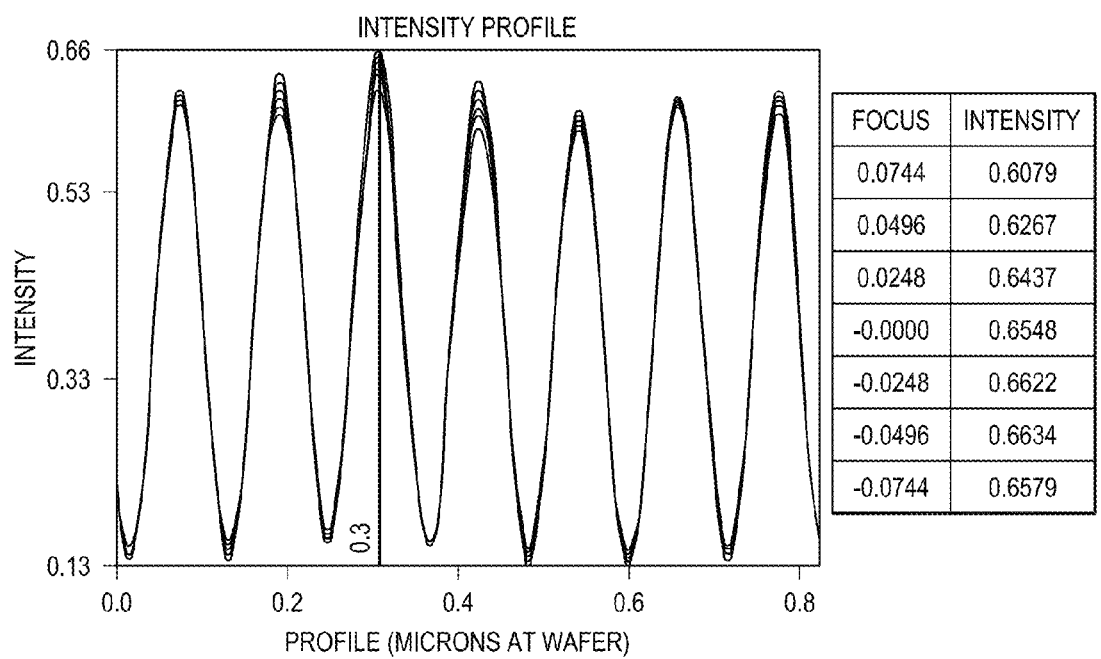

FIGS. 8A-8B illustrate comparisons between repair defects that can occur without the shielding layer (FIG. 8A) and the lack of repair defects that occurs with the shielding layer (FIG. 8B). As can be seen in FIG. 8A, without the shielding layer 107, additional defects, such as defects that register a maximum intensity of greater than 0.6793, can occur in the photolithographic mask 100 during a repair process, such as the defect 801 along line 8-8' illustrated in FIG. 8A. In the chart of FIG. 8A, this defect is illustrated by the increase in the intensity profile at line 8-8', which has an Aims intensity increase of about 17.2%.

FIG. 8B illustrates the reduction in defects that can occur when the shielding layer 107 is utilized to control the activation energy and the rate of reaction. In particular, the defects have been greatly reduced from the structure in FIG. 8A, with the defects having an intensity of no greater than about 0.6548, only registering an increase in the intensity profile of about 2.1%, much less than the increase in intensity of 17.2% in FIG. 8A.

Figure 9:
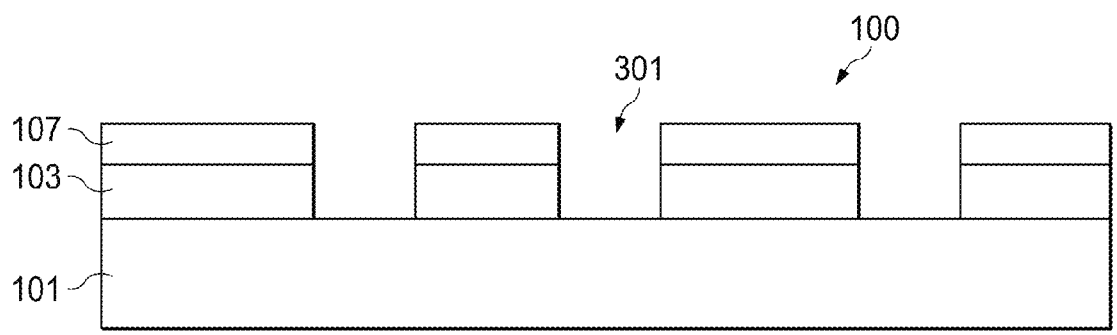
FIG. 9 illustrates a double layer embodiment of the photolithographic mask in accordance with an embodiment.

FIG. 9 illustrates another embodiment which utilizes a double layer structure instead of the triple layer structure (e.g., the absorbance layer 103, the ARC layer 105, and the shielding layer 107) described above with respect to FIGS. 1-8. In this embodiment the absorbance layer 103 is utilized with the shielding layer 107, but the ARC layer 105 is not utilized. In such as embodiment the absorbance layer 103 may be formed to a thickness of between about 35 and about 60 nm, such as about 37 nm. The shielding layer 107 may be formed to thickness of between about 5 nm and about 20 nm, such as about 18 nm. In this embodiment the photolithographic mask 100 may have a reflectance percent of about 15.8%.

Once the photolithographic mask 100 has been manufactured, inspected, verified, and repaired if necessary as described above, the photolithographic mask 100 may be utilized to help pattern, e.g., structures on a semiconductor wafer (not illustrated). For example, the photolithographic mask 100 may be placed into a photolithographic illumination machine. Once in place, the photolithographic mask 100 may be illuminated by an energy source, with the absorbance layer 103 blocking portions of the light to form a patterned light pattern. This patterned light pattern may be focused and directed towards a photosensitive material on a semiconductor substrate, illuminating the photosensitive material in a desired pattern. Once illuminated, the photosensitive material may be developed and used as a mask to form devices, metallization layers, isolation regions, and other structures on or within the semiconductor wafer.

In accordance with an embodiment, a method for forming a photolithographic mask comprising forming an absorbance layer over a substrate and forming a shielding layer over the absorbance layer, wherein the shielding layer has a higher activation energy than the absorbance layer, is provided. The absorbance layer is repaired using the shielding layer as a mask.

In accordance with another embodiment, a method of repairing a photolithographic mask comprising directing an electron beam at a shielding layer overlying an absorbance layer of a photolithographic mask, wherein both the shielding layer and the absorbance layer comprise molybdenum and silicon and wherein the shielding layer has a higher activation energy than the absorbance layer, is provided. A portion of the absorbance layer is removed through the shielding layer utilizing the electron beam.

In accordance with yet another embodiment, a photolithographic mask comprising a substrate and an absorbance layer over the substrate is provided. The absorbance layer has an intensity profile less than about 0.66.

Although the present embodiments and their advantages have been described in detail, it should be understood that various changes, substitutions and alterations can be made herein without departing from the spirit and scope of the disclosure as defined by the appended claims. For example, the materials utilized for the shielding layer and the materials utilized for the absorbance layer may be adjusted as desired while still remaining within the scope of the embodiments. Additionally, the various methods to form and remove the layers may be modified as desired.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   depositing a structure over a substrate, wherein the structure has a first rate of reaction, the structure comprising:
      an absorbance layer over the substrate; and
      an anti-reflective layer over the absorbance layer; and
   modifying the first rate of reaction of the structure to a second rate of reaction of the structure different from the first rate of reaction; and repairing the structure after the modifying the first rate of reaction until the absorbance layer has an intensity profile less than about 0.66.

2. The method of claim 1, wherein the modifying the first rate of reaction of the structure to the second rate of reaction of the structure comprises depositing a shielding layer.

3. The method of claim 2, wherein the shielding layer and the absorbance layer comprise a first material with different compositions.

4. The method of claim 3, wherein the anti-reflective layer comprises the first material with a different composition.

5. The method of claim 4, wherein the first material is opaque molybdenum silicide.

6. The method of claim 2, wherein the shielding layer comprises a metal/metal oxide material.

7. A method comprising:
depositing a layer of opaque molybdenum silicide onto a substrate, wherein the layer of opaque molybdenum silicide comprises:
a first region adjacent to the substrate with a first silicon composition;
a second region on an opposite side of the first region from the substrate, the second region having a second silicon composition different from the first silicon composition;
a third region on an opposite side of the second region from the substrate, the third region having a third silicon composition higher than the first silicon composition;
patterning the layer of opaque molybdenum silicide; and
repairing the layer of opaque molybdenum silicide.

8. The method of claim 7, wherein the second silicon composition is between 50% and 55%.

9. The method of claim 8, wherein the third silicon composition is between 45% and 52%.

10. The method of claim 7, wherein the repairing the layer of opaque molybdenum silicide is performed at least in part with an electron beam process.

11. The method of claim 7, wherein the third region has a higher activation energy than the first region.

12. The method of claim 7, wherein the first region has a thickness of between 35 nm and 60 nm.

13. The method of claim 12, wherein the second region has a thickness of between 5 nm and 20 nm and wherein the third region has a thickness of between 5 nm and 20 nm.

14. The method of claim 7, wherein the opaque molybdenum silicide comprises nitrogen.

15. A method comprising:
using a first set of deposition parameters to deposit a first layer of opaque molybdenum silicide with a first concentration of silicon;
using a second set of deposition parameters different from the first set of deposition parameters to deposit a second layer of opaque molybdenum silicide with a second concentration of silicon higher than the first concentration of silicon;
using a third set of deposition parameters different from the first set of deposition parameters and different from the second set of deposition parameters to deposit a third layer of opaque molybdenum silicide with a third concentration of silicon higher than the first concentration of silicon;
patterning the first layer, the second layer, and the third layer; and
repairing the first layer.

16. The method of claim 15, wherein the repairing the first layer utilizes at least in part an electron beam process.

17. The method of claim 16, wherein the repairing the first layer utilizes an etchant.

18. The method of claim 17, wherein the repairing the first layer is performed at a pressure of between $2e^{-5}$ mbar and $5e^{-5}$ mbar.

19. The method of claim 18, wherein the repairing the first layer is performed at a temperature of between 20° C. and 24° C.

20. The method of claim 19, wherein the etchant is introduced to the first layer at a flow rate of between 0.05 sccm and 0.5 sccm.

* * * * *

UNITED STATES PATENT AND TRADEMARK OFFICE
CERTIFICATE OF CORRECTION

| | |
|---|---|
| PATENT NO. | : 10,156,783 B2 |
| APPLICATION NO. | : 15/443535 |
| DATED | : December 18, 2018 |
| INVENTOR(S) | : Tu et al. |

It is certified that error appears in the above-identified patent and that said Letters Patent is hereby corrected as shown below:

On the Title Page

Item (73) Assignee, Line 1, delete "Manufactuing" and insert --Manufacturing--.

Signed and Sealed this
Fifth Day of March, 2019

Andrei Iancu
*Director of the United States Patent and Trademark Office*